United States Patent [19]

Perepezko et al.

[11] Patent Number: 4,494,136
[45] Date of Patent: * Jan. 15, 1985

[54] SEMICONDUCTOR DEVICE HAVING AN AMORPHOUS METAL LAYER CONTACT

[75] Inventors: John H. Perepezko; John D. Wiley, both of Madison, Wis.

[73] Assignee: Wisconsin Alumni Research Foundation, Madison, Wis.

[*] Notice: The portion of the term of this patent subsequent to Sep. 21, 1999 has been disclaimed.

[21] Appl. No.: 419,589

[22] Filed: Sep. 17, 1982

Related U.S. Application Data

[63] Continuation-in-part of Ser. No. 81,859, Oct. 4, 1979, Pat. No. 4,350,994.

[51] Int. Cl.³ .................. H01L 29/12; H01L 23/54
[52] U.S. Cl. .......................... 357/67; 357/2; 357/71; 357/65; 357/68
[58] Field of Search ............... 357/2, 65, 67, 68, 71

[56] References Cited

U.S. PATENT DOCUMENTS

| | | | |
|---|---|---|---|
| 3,582,324 | 6/1971 | Kunert et al. | 357/67 |
| 3,607,240 | 9/1971 | Kunert et al. | 357/67 |
| 3,664,874 | 5/1972 | Epstein | 357/67 |
| 3,675,090 | 7/1972 | Neale | 357/2 |
| 3,746,944 | 7/1973 | Naraoka et al. | 357/67 |
| 3,886,577 | 5/1975 | Buckley | 357/71 |
| 4,177,475 | 12/1979 | Holmberg | 357/2 |
| 4,181,913 | 1/1980 | Thornburg | 357/67 |
| 4,350,994 | 9/1982 | Perepezko et al. | 357/71 X |

Primary Examiner—Andrew J. James
Assistant Examiner—S. V. Clark
Attorney, Agent, or Firm—Howard W. Bremer

[57] ABSTRACT

A metallization system for high temperature use comprises a layer strongly bonded to the surface of a semiconductor substrate in the form of an alloy of a metal in the amorphous state in which the metal is a transition metal, transition metal/normal metal alloy or transition metal/metalloid alloy having a crystallization temperature from the amorphous state in excess of 200° C. The as-deposited amorphous films exhibit good adhesion and show at least an order of magnitude improvement in corrosion protection compared to polycrystalline coatings. Annealing treatments below the glass transition temperature have been found to further enhance this protective behavior of the amorphous films.

16 Claims, 4 Drawing Figures

SEMICONDUCTOR DEVICE HAVING AN AMORPHOUS METAL LAYER CONTACT

CROSS-REFERENCE TO RELATED APPLICATION

This application is a continuation-in-part of copending application Ser. No. 81,859, filed Oct. 4, 1979 now U.S. Pat. No. 4,350,994.

BACKGROUND OF THE INVENTION

The present invention relates in general to improved metallization systems for semiconductors or devices and integrated circuits, and in particular to contacts, such as Ohmic contacts or Schottky barrier contacts, for high temperature semiconductor devices and to methods and compositions for use in the manufacture of such metallization systems.

There are many important applications where it is desirable to use electrical transducers, discrete semiconductor devices or complete circuits capable of sustained operation at elevated temperatures; for example, at temperatures up to 500° C. and above. Such applications include in situ monitoring of jet engines, internal combustion engines, turbines, nuclear reactors, geothermal holes, and "hot" oil wells. The high temperatures and often corrosive environments encountered in these applications, however, present extremely difficult reliability and lifetime problems which are not being met with existing semiconductor devices or technologies. Particularly, severe are the problems of hermetic packaging; internal device passivation; and metallurgical proglems associated with the formation of Ohmic contacts to the semiconductor, metal interconnects, and bonded lead wires.

A crucial step in developing reliable high temperature devices of the type described is believed to be that of isolating a semiconductor which is capable of functioning at elevated temperatures, and a metallization system that is compatible with the semiconductor during high temperature operation. Compatibility requires that: (1) the chosen metal or metals exhibit good adhesion to the semiconductor, (2) acceptable microstructural and mechanical properties are exhibited at the operating temperatures, (3) the selected metal/semiconductor system is capable of producing good Ohmic (non-blocking or non-injecting) characteristics with minimal specific contact resistance at the operating temperatures, and (4) the overall system is stable in its electrical, structural and mechanical properties for periods of at least several thousand hours at the operating temperatures.

In the design and fabrication of semiconductor devices and integrated circuits, metals are used to perform at least four separate functions; namely, to form (1) Ohmic contacts to the semiconductor; (2) rectifying or Schottky contacts to the semiconductor; (3) interconnects; and (4) gate metallizations in MOS devices.

THe physical properties demanded of the metal are slightly different in each case, so that no one elemental metal or alloy is optimum for all four functions. The search for appropriate metals for functions (1) and (2) is largely empirical, because there is no way to predict, a priori, whether a given metal will form good quality Ohmic or Schottky contacts with a given semiconductor. Function (3) requires that the metal have a high electrical conductivity to minimize $I^2R$ losses and parasitic resistances. With respect to function (4), high conductivity is less important than the metal's work function (which plays a role in determining the MOS threshold voltage). In addition to these considerations, the choice of an appropriate metallization should take into account practical constraints imposed by processing and reliability considerations.

Such practical constraints include at least the following processing considerations: (a) compatibility with practical deposition methods; (b) compatibility with standard patterning techniques; (c) compatability with standard wire bonding techniques; (d) good adhesion to the semiconductor and passivating layers; and (e) compatability with thermal cycling. The applicable reliability considerations include: (f) good edge definition and line-width control; (g) good thermal conductivity; (h) resistance to electromigration; (i) resistance to interdiffusion or reaction with substrates; and (j) resistance to formation of intermetallic compounds.

Those constraints, combined with the basic functional requirements, place severe restrictions on the choice of metallization. In practice, some of the constraints require conflicting properties; e.g., reactivity vs. inertness, making it difficult to find a single, simple metallization which will suffice for all functions. This often leads to the use of multicomponent or multilayer metallizations with various different metals serving as adhesion layers, diffusion barriers, bonding or capping layers, etc.

Moreover, during processing, the metal layers are often exposed to high temperatures and, during operation, they may be exposed to moderately elevated temperatures, temperature gradients and high current densities. These environmental conditions serve to accelerate diffusion and chemical reactions among most metal, semiconductor, and insulating materials leading, in many cases, to the formation of unwanted compounds which can cause device failure for electrical or mechanical reasons.

From the consideration of the required semiconductor characteristics, such as intrinsic carrier concentration, it is clear that compounds such as GaAs and GaP are among the most attractive candidates for high-temperature applications above 200° C. While present technology can be used to produce satisfactory Ohmic contacts to GaAs and GaP, these methods are not capable of being applied to high temperature devices.

Most metals, when deposited onto a substrate by sputtering, evaporation, or plating, produce films having a polycrystalline microstructure. This is true of all metals and alloys currently used in semiconductor devices and integrated circuit metallizations. During pattern delineation, the grain boundaries often etch preferentially, leading to poor edge definition and poor line-width control. It has been found that the best edge resolution is obtained with fine-grained metals. As the grain size is reduced, however, grain-boundary diffusion becomes increasingly troublesome and all processes controlled by diffusive transport, such as phase separation, compound formation, etc., are enhanced. Electromigration, a very severe problem occurring at high current density ($J \gtrsim 10^4$ A/cm$^2$), is also enhanced along grain boundaries. As a result, in conventional metallizations, those films which afford the highest pattern resolution pose the most severe reliability problems due to grain-boundary diffusion and electromigration.

It is believed that simple metallization systems using the minimum number of component overlayers have the best chance for success in achieving high-temperature stability over long durations. A prime requirement for high stability of a contact overlayer is resistance to interdiffusion reactions, which implies an overlayer component that is effectively a diffusion barrier. To satisfy this requirement, the overlayer material that is used should have a high kinetic resistance to any change or modification of its atomic structural state at the working temperature of the device.

This invention takes a novel and unique approach to this problem by making use of the characteristic of some metal and alloy systems to undergo a vitrification to a compositionally homogeneous amorphous phase. The as-deposited amorphous films have good adhesion and show at least an order of magnitude improvement in corrosion protection compared to polycrystalline coatings. Moreover, annealing treatments below the glass transition temperature have been found to enhance further this protective behavior of amorphous films.

DETAILED DESCRIPTION OF THE INVENTION

Figure 2:
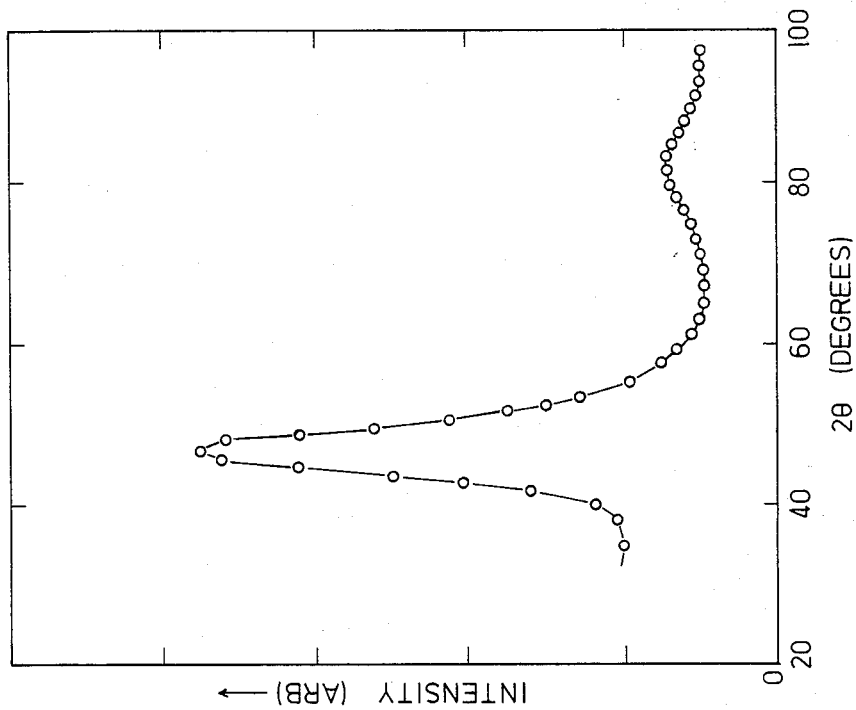
FIG. 2 is a diffractometric scan of a typical amorphous Ni-Nb film embodying the features of this invention.

The macroscopic manifestation of the transition from liquid to glass is a homogenous and continuous hardening, as measured by the shear viscosity, with decreasing temperature. Accompanying the hardening are changes in physical properties, such as abrupt decreases in heat capacity and thermal expansion coefficients which are related to the inability of the material to achieve configurational equilibrium during the time of observation in the high-viscosity regime. Changes in atomic configuration in liquids correspond roughly to the shear viscosity. At a viscosity of $10^{13}P$, the time constant, $\tau_c$, for configurational adjustment is of the order of 0.5 hr and increases to about one day at a viscosity of $10^{15}P$.

In most experiments, the onset of the glass transition occurs at a viscosity of about $10^{13}P$, which is taken as an operational definition of the glass-transition temperature ($T_g$). From a microscopic view, the distinction between an amorphous solid and a crystalline solid is clearer. The equilibrium atomic positions in a crystalline solid are correlated over many atomic spacings. In an amorphous solid, diffraction examination has demonstrated that any translational correlations in the equilibrium position of the constituent atoms do not extend beyond distances of a few atomic diameters.

The limit of metastability of a highly-undercooled liquid is marked by the onset of a homogeneous nucleation of the crystalline state unless the glass transition intervenes at a temperature above the nucleation temperature. For metals and metallic alloys, the onset of homogeneous nucleation has been taken to occur at an undercooling equivalent to $0.2\ T_m$, where $T_m$ is the absolute melting temperature. Recent work has demonstrated that many liquid metals and alloys may be undercooled to a significantly greater extent than $0.2\ T_m$. In some cases, undercoolings approaching $0.5\ T_m$ may be attained in carefully prepared samples. While such findings are important in extending the range of liquid undercooling, which is accessible to study, they also serve to emphasize that most solidification reactions occur as a result of the heterogeneous catalysis of nucleation.

The crystallization of a liquid at large undercoolings of 100° C. or more is a very rapid process involving the propagation of a solidification front at velocities of the order of cm/sec. However, the reaction is thermally activated so that not only is it necessary for sufficient driving force to be present, but also adequate atomic mobility must be available. Therefore, the extent and occurrence of crystallization may be limited if a liquid can be undercooled rapidly to a low temperature where atomic mobility is sluggish. This is the basis of the most commonly used techniques for generating the amorphous state in metallic systems.

While many of the early investigations of glass formation in metallic alloys involved the use of the "splat cooling" technique in which a small amount of liquid is chilled rapidly by impingement on a substrate at high velocity, it is recognized that the cooling rates with this procedure are in the range from about $10^5$ to $10^8$ °K./sec. Basically, "splat cooling" is limited by the rate of heat conduction between the small liquid sample and the underlying substrate.

More effective cooling is possible by employing an atomic deposition approach, as represented by sputter deposition in which atoms impinge on a solid surface and are condensed continuously to form a film. Cooling during vapor deposition is determined by the time required for an individual atom to lose its initial kinetic energy and to achieve thermal equilibrium with the substrate. The equilibration time for a vapor deposited atom is of the order of $10^{-12}$ sec. Thus, for an initial temperature of $1-2\times 10^3$ °K., a cooling rate of the order of $10^{15}$ °K./sec is anticipated. The ultra-rapid quench rate possible with vapor deposition suggests that atoms are effectively frozen in place within a few atom diameters of their point of impingement on the substrate. As a consequence, a greater variety of metallic alloys may be vitrified by such vapor deposition techniques.

An understanding of the factors that tend to be associated with good glass-forming ability is important not only in providing guidance in selecting systems which may be vitrified easily, but also in judging the relative thermal stability of the amorphous phase. Often, a system which forms a glass readily is also a system with a relatively high value of $T_g$ and of the reduced glass temperature, $T_g/T_m$. As a consequence, alloy systems which exhibit amorphous phases which are stable at high temperature are also systems with high melting temperatures.

In accordance with the practice of this invention, such amorphous (glassy or non-crystalline) metals are used in semiconductor device and integrated circuit metallization applications. Being amorphous, the metals contain no grain boundaries or macroscopic inhomogeneities which could cause anisotropic or locally enhanced etching. The ultimate limit to edge resolution achievable with glassy metals is set by the sizes of microscopic composition fluctuations ($\approx 10$–$20$ Å) or voids ($<10$ Å). The absence of grain boundaries also gives excellent protection against electromigration. Diffusive transport is very slow in glassy metals such that they are exceptionally resistant to interdiffusion and compound formation.

There are a number of additional advantages that are associated with the application of amorphous phases as contact materials for high-temperature service. At temperatures below the glass transition temperature, $T_g$, amorphous phases are kinetically stable and resistant to compound formation. The electrical resistivity of amorphous metallic alloys is in the range of about 10–100 $\mu\Omega$ cm which is satisfactory for contact applications.

In addition, below $T_g$ the interdiffusion rates between an amorphous overlayer and the underlying crystalline substrate can be anticipated, from structural considerations, to be very sluggish. The amorphous overlayer contact is an effective diffusion barrier. Since $T_g$ has been found to scale with the melting temperature, $T_m$, and range from about $0.4\,T_m$ to $0.6\,T_m$ for many metals, amorphous phase contacts for high-temperature applications require the use of relatively high melting point metals such as refractory metals.

Among the alloys that appear to have suitable thermal stability to remain in the amorphous state at temperatures up to about 500° C. are Nb-Ni and Ta-Ni. For example, in the Nb-Ni system, alloys in the range from about 30 to 85 atomic % Ni deposit as an amorphous phase during RF sputtering and remain in the amorphous state upon annealing to temperatures up to about 600° C.

In accordance with the practice of this invention, the metal or alloy is deposited as an amorphous material on a semiconductor, to form a contact capable of use at high temperatures. It is necessary to use, as the contact metal, a metal or alloy which can be deposited as an amorphous or glassy phase and which is characterized by a crystallization temperature ($T_c$) considerably higher than the temperature to which the device will be exposed during metal processing, such as annealing, or during use so that the contact layer will remain in the desired amorphous or glassy state.

As used herein, and as described in greater detail with reference to Example 1, the crystallization temperature ($T_c$) is the temperature at which a film deposited according to the method of the present invention does not exhibit crystalline properties for a period of at least one hour.

For this purpose, use can be made of amorphous alloys having a high crystallization temperature from the amorphous state, such as a temperature above 200° C. and preferably above 500° C. Such amorphous metallizations can be produced from various transition metals, transition metal/normal metal alloys or transition metal/metalloid alloys. The transition metals and alloys capable of being used to form the amorphous contact, in accordance with the practice of this invention, are selected from the transition metals to the left of the noble metals, copper, silver, and gold in the periodic table of elements.

The invention will be described with reference to the use of binary alloys but it will be understood that use can be made of binary, ternary and more complex alloys which are metastable in the amorphous phase. The description, as related to binary alloys, is made primarily for the sake of simplicity.

Representative of such binary systems are Ni-Nb, Ni-Mo, Mo-Si and W-Si, all of which yield high $T_g$ amorphous alloys. By RF sputtering, amorphous films have been produced of Ni-Nb over the composition range, $Ni_{0.85}Nb_{0.15}$ to $Ni_{0.30}Nb_{0.70}$. These films have crystallization temperatures in the 600° C. range, with the highest $T_c$ occurring for the composition $Ni_{0.65}Nb_{0.35}$. Use can also be made of Ni-Mo alloys within the composition range near $Ni_{0.65}$-$Mo_{0.35}$ having $T_c$ values of 500°–600° C.

The Mo-Si and W-Si systems are interesting for a number of reasons. Pure Mo or W have often been proposed as good candidates for high-temperature metallizations on both Si and compound semiconductors. Their use has been limited primarily by the interdiffusion and compound-formation problems previously discussed, which problems may be alleviated by the use of amorphous films. The Mo-Si and W-Si phase diagrams are similar, showing compounds $T_5Si_3$, $T_3Si_2$ and $TSi_2$, where T is Mo or W and eutectics at roughly 20% and 60% Si. The eutectic temperatures are all in the 1900°–2300° C. range, leading to the expectation of $T_c$ values of about 1000° C.

Ternary compositions are particularly attractive for the formation of Ohmic and metal contacts. The large atomic size and high melting point of Hf, for example, makes it suitable for a ternary addition to increase the stability of binary alloys in the single-phase amorphous state.

Substrate requirements for successful vapor deposition of amorphous metals, in accordance with the practice of this invention, are easily satisfied by almost any crystalline or amorphous solid. Incident metal atoms come to thermal equilibrium with the surface in times characteristic of a few atomic vibrations ($\sim 10^{-12}$ sec). Thus, the main requirement is that the substrate surface be at a temperature well below the glass-transition temperature during deposition. This, in turn, requires that the substrate have a thermal conductivity adequate for rapid transfer of the heat-of-condensation to a heat sink.

The fact that amorphous metals have been deposited successfully on such notably poor thermal conductors as Pyrex leaves little doubt that all common semiconductors will provide adequate heat-sinking and be usable as substrates.

As the semiconductor substrate or base, use has been made of silicon, GaAs, GaP, silicon oxide, glass and $Al_2O_3$.

Film deposition can be accomplished by sputtering from composite cathodes. Two of the systems that have been used are, a DC getter-sputtering system and an RF system.

In the DC system, the cathode, anode and plasma are enclosed in a Ni-plated chamber which serves as the "getter" surface. With the substrate protected by a movable shutter, a predeposition sputtering cycle is used to bury any foreign contaminants under a fresh layer of cathode material. The shutter is then opened and a film is deposited on the substrate. Depositions are carried out at an Ar pressure $\lesssim 50$ Torr and a power level ≲1 kW. This system has no provision for substrate cooling, but substrate temperatures are typically below 200° C. during deposition. The small cathode size is convenient and economical for experimentation with varying compositions.

The RF system allows very high sputtering rates at relatively low Ar pressures (≲5 Torr) and, owing to the large cathode size, RF sputtering produces much more uniform films than the DC System. Use is made of composite cathodes, such as formed with overlays of second metals on a pure Ni base. Other base cathodes are available for use in the RF systems including Cr, Ti, Al and Si.

Figure 1:
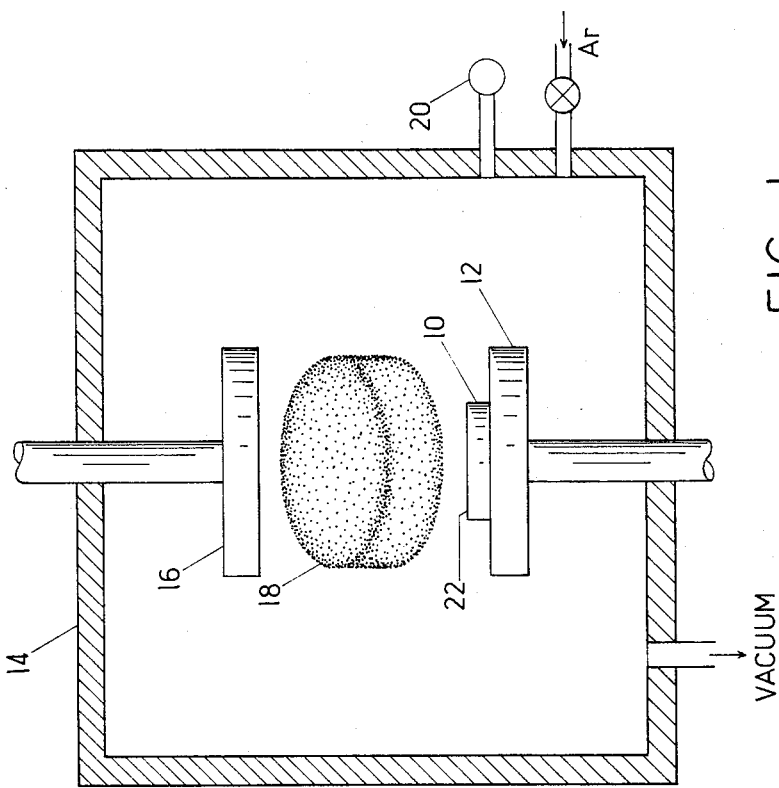
FIG. 1 is a schematic diagram of equipment for depositing an amorphous layer on a semiconductor substrate or base by RF sputtering.

Referring to FIG. 1, an arrangement is shown for the preparation of a high temperature semiconductor device in which the amorphous layer of a transition metal or alloy is deposited by RF sputtering.

Specifically, the substrate 10 is supported on an anode in the form of a platform 12 within a sealed vacuum chamber 14 which is backfilled with an inert gas, such as Argon, to a pressure suitable for sputtering as measured on a vacuum gauge 20. The composite cathode in the form of a plate 16 is spaced substantially parallel to the plate 12.

The RF sputtering voltage is sufficient to ionize the inert gas (Argon), causing a glow discharge 18 to form between the cathode 16 and the anode 12. Argon ions are attracted to the cathode where they in turn knock loose atoms of the cathode containing the metal or alloy to be deposited. The metal atoms, which are dislodged from the cathode, travel to the anode where some of them strike and adhere to the substrate 10. It may sometimes be desirable to circulate a cooling medium, such as water, through the substrate platform (anode) 12 to prevent a rise in the substrate temperature so that only amorphous metal films 22 will be deposited and retained on the substrate. Other deposition methods such as magnetron sputtering or evaporation techniques could also be used.

FIG. 2 shows a diffractometric scan of an amorphous Ni-Nb film having a thickness of 3μ deposited by RF sputtering on an Si substrate. The signal-to-noise ratio was 4:1 for the lower peak. The as-deposited films are amorphous, as revealed by the absence of any sharp crystalline X-ray diffraction peaks.

Amorphous Ni-Nb films have been deposited in the manner described on substrates of Si, GaAs, CaP, $SiO_2$, glass and $Al_2O_3$. In all cases, the films are hard, mirror-like and show outstanding adhesion to the substrates. In adhesion tests, the films have been found to be exceptionally difficult to scratch and cannot be pulled from the substrates with tape or epoxy-bonds.

The films appear to be extremely corrosion resistant. Films of approximately 1μ thickness are unaffected by 5-10 min. immersion in acid such as HCl or $HNO_3$ at room temperature. The same films can, however, be totally removed in ≲2 min. with a standard Nb-etch (7 HF-75 HCl-25 $HNO_3$).

Maximums of the sheet resistance of the films give values of 0.3-0.5Ω/□ for films of ~1μ thickness. Resistivities are thus in the 30-55μΩ cm range.

It will be understood that the crystallization of amorphous metals in the temperature range of the glass transition and above is clearly controlled by kinetic factors. As a consequence, it must be emphasized that an experimentally determined value of $T_c$, the crystallization temperature, depends to some extent on the timescale of the measurement. For example, a sample may crystallize in 10 hours at 580° C., in 1 hour at 600° C. and in 1 minute at 620° C. The onset stage of crystallization is also dependent on the selected threshold level of crystallinity and on the sensitivity of the experimental measurement.

Furthermore, the value of $T_c$ and the crystallization onset may be expected to be influenced by annealing treatments that are performed below $T_c$, but in the vicinity of the glass transition. The annealing treatments can yield a structural relaxation and a stress-relief of the as deposited amorphous film which can also modify the atomic transport associated with crystallization.

During the crystallization of vapor deposited amorphous metal films, it is also necessary to consider both the free surface and the substrate/film interface as potential sites for the initiation of crystallization. Any modification of these sites can act to alter the development of crystallization. However, for practical purposes, the characteristic time for crystallization is a function of temperature so that reasonable estimates of the maximum "operating temperatures" of amorphous metallization systems can be obtained using short term anneals. Except where indicated otherwise, the results reported herein were obtained using a standard annealing time of 1 hour.

EXAMPLE 1

In order to determine the one-hour crystallization temperature of a given alloy composition, a sample of an amorphous metal deposit was sealed in a quartz capsule which was evacuated to a pressure ≲$10^{-5}$ Torr and gettered by a small Ti slug. The annealing treatment was initiated at 400° C., after which the sample was removed from the capsule for examination by X-ray Diffraction (XRD). If there is no evidence of crystallization, the same sample is resealed in a capsule and annealed at 500° C. for one hour. This procedure is repeated at 100° C. increments until crystallization is detected. A new sample from the same sample batch is then annealed at the penultimate temperature, examined for crystallinity and reannealed at successively higher temperatures using 50° C. increments. Finally, a third sample is used to determine $T_c$ at increments of 25° C.

Figure 3:
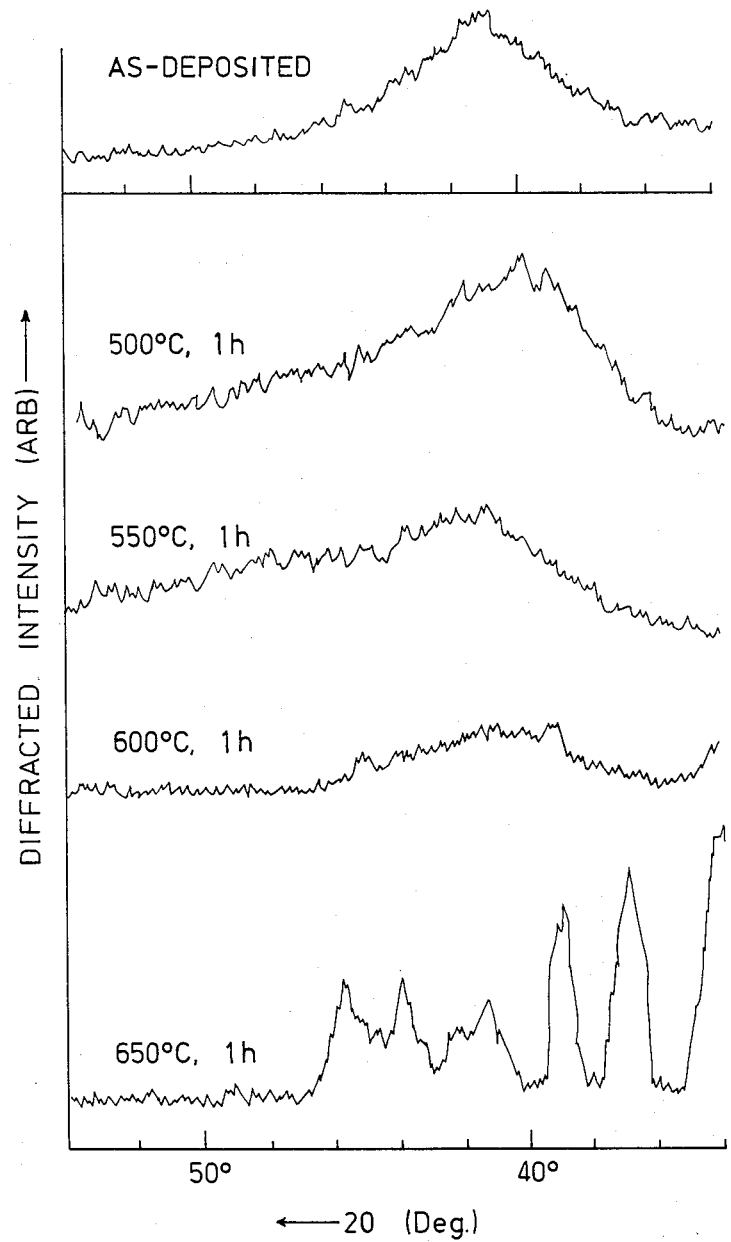
FIG. 3 shows AES depth-profiles of Cu, Ni, and Nb. The top trace shows the as-deposited structure: a Cu layer on amorphous Ni-Nb. The middle trace shows that there was very little interdiffusion after 10 hours of annealing at 500° C. The bottom trace shows considerable interdiffusion after only 1 hour at 600° C. The rapid interdiffusion at 600° C. is a consequence of crystallization.

The results of a typical testing procedure are illustrated in FIG. 3. The plots show a sequence of XRD scans for initially amorphous Ni-35% Mo films. The detailed shape of the amorphous peak varies somewhat from sample to sample, depending on the film thickness and composition. Also, at the sensitivity of conventional XRD examination, it is somewhat difficult to determine whether or not small features associated with the amorphous peak correspond to the early onset stages of crystallization. However, XRD does provide a good measure for determining, in an operational sense, the appearance of massive crystallization by the clear evidence associated with the development of numerous sharp diffraction peaks.

For example, the pattern in FIG. 3 obtained after an annealing treatment at 600° C. displays small diffraction peaks at 2θ=39° and 45°. These features are reproducible and apparently indicate a small volume fraction of crystallites in an amorphous matrix. After the 650° C. anneal, the 39° peak is quite strong, but the 45° peak is diminished. This result suggests that the path of crystallization in the Ni-Mo system may be complex and involve intermediate phase reactions.

Some typical results of the annealing studies are listed in Table I. The temperature $T_o$ is the highest 1 hour annealing temperature at which no evidence of crystallinity was observed by XRD. The temperature $T_1$ is the lowest 1 hour annealing temperature at which some evidence of crystallinity was observed.

TABLE I

| Alloy | Composition (a/o)-atomic percent | $T_0$ (°C.) | $t_1$ (°C.) |
|---|---|---|---|
| Ni—Nb | 55 a/o Ni | 500 | 550 |
| Ni—Nb | 57 a/o Ni | 575 | 600 |
| Ni—Mo | 55 a/o Ni | 525 | 550 |
| Ni—Mo | 65 a/o Ni | 550 | 600 |
| Mo—Si | 60 a/o Mo | 550 | 600 |

As the results in Table I indicate, all of the films listed were maintained for at least 1 hour at temperatures of 500° C. and above without crystallization.

EXAMPLE 2

Figure 4:
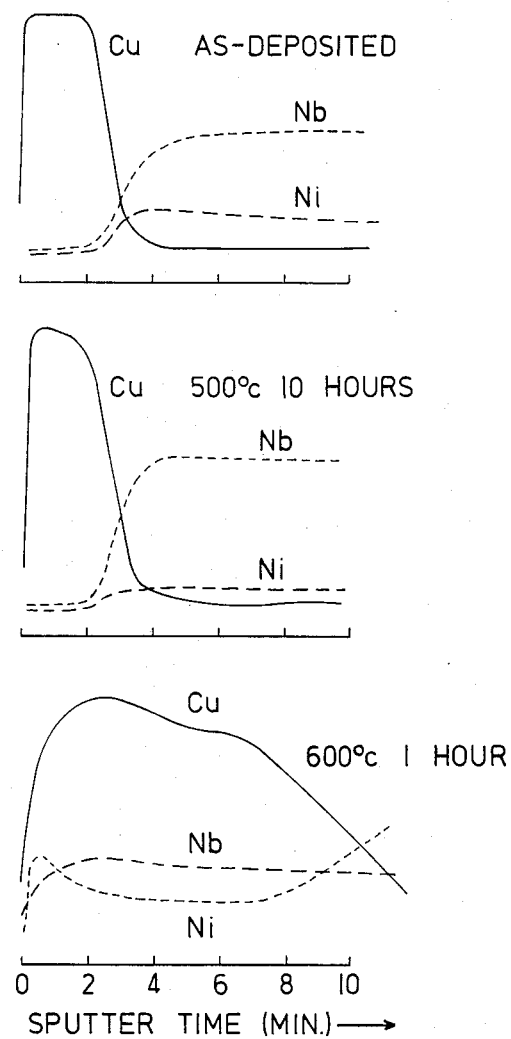
FIG. 4 illustrates X-ray diffractometer scans of an initially amorphous film of Ni-Mo after 1 hour anneals at successively higher temperatures. The vertical scales are arbitrary. Gain settings vary somewhat among traces, but horizontal scales are identical. There is slight evidence of the onset of crystallization at 600° C., and nearly complete crystallization at 650° C.

The use of the XRD method to provide an operational measure of crystallization can be illustrated with another example concerning diffusion behavior. In this case, Auger Electron Spectroscopy (AES) together with argon beam sputtering was used to study the interdiffusion between amorphous metal films and an overlayer of Cu and between amorphous metal films and the semiconductor substrate. The results shown in FIG. 4 were obtained for a Cu film on an amorphous Ni-Nb film and an approximate sputtering rate of 250 Å/min. After 10 hours of annealing at 500° C., no significant motion of the Cu/Ni-Nb interface was observed and very little interdiffusion took place. This can be determined by the similarity between the trace of the annealed sample (500° C., 10 hours) with that for the as-deposited film.

As indicated in Table I, the $T_c$ for Ni-Nb by the XRD method is greater than 500° C. That behavior indicates that an amorphous Ni-Nb film of about 1000 Å could serve as an excellent diffusion barrier to Cu. After one hour at 600° C., however, the Cu, Ni and Nb have interdiffused thoroughly to a depth of more than 2000 Å into the Ni-Nb film. Other Ni-Nb films of the same composition were found to crystallize in one hour at 575° C. by the XRD method of detection.

Thus, it is clear that crystallization is responsible for the massive penetration of Cu into the Ni-Nb film (probably by grain boundary diffusion). Example 2 also demonstrates the relationship between the operational measure of crystallization by XRD and the diffusion barrier characteristic of amorphous metallization systems.

EXAMPLE 3

Samples of annealed, carbide rolled 316 stainless steel were cut from roll stock and electropolished. These substrate materials were then coated with the amorphous Ni-Nb material. The sample substrate material was cut into approximately 2 inch square pieces and a total of 16 (four groups of four samples) of these pieces were coated simultaneously by RF sputtering. Prior to coating, each group was processed (cleaned) in the following manner: Group I, sample Nos. 1-4—no cleaning (as received), Group II, sample Nos. 5-8—degreased (5 minutes in TCE, methanol rinse and 5 minute methanol soak), Group III, sample Nos. 9-12—acid cleaned (5 minutes ultrasonic bath of 2 ml HCl and 200 ml deionized water), and Group IV, sample Nos. 13-16—base cleaned (5 minutes ultrasonic bath of 0.5 gm Alconox in 200 ml deionized water) with the samples of the latter three groups being rinsed with deionized water and dried with nitrogen gas after treatment.

Each sample was numbered prior to cleaning. The samples were then plated in the RF sputtering unit and Ni-Nb was sputtered onto the 316 stainless steel samples from a divided patterned target for 30 minutes at a power of 1 kW. This resulted in a coating approximately 1 micron thick being deposited. One sample (Nos. 4, 8, 12 and 16) from each group was kept as a control, while the remainder were tested as follows.

First, each sample was examined microscopically for structure and defects. After this examination, photographs were taken of any structure observed. Each sample was then subjected to X-ray chemical analysis to determine the ratio of nickel atoms to niobium atoms in the coatings. The samples were then removed for corrosion experimentation.

Corrosion tests were performed in three ways. First, samples 1, 5, 9 and 13 were subjected to wet corrosion testing by building dams of wax on the coated surface of each sample to form four dammed areas, filling three of the dammed areas with one of the following solutions: 1 molar ferric chloride, 2 molar hydrochloric acid or 2 molar sodium chloride, and examining the sample microscopically at periods of 2, 4, 8 and 24 hours. Second, samples 2, 6, 10 and 14 were cut into 1 cm squares, spot welded to copper wires and potted in epoxy to expose only the coating to the solution to be tested. Samples of each were then tested electrochemically in 1 normal sulfuric acid and 1 molar hydrochloric acid according to ASTM Standard G 5-72 for anodic polarization measurements. Finally, the remaining samples (Nos. 3, 7, 11 and 15) were sealed in test tubes containing concentrated hydrochloric acid, concentrated nitric acid or concentrated sodium hydroxide solutions.

Results of the testing were as follows: microscopic examination showed that the coatings were essentially featureless as one might expect in an amorphous coating. There was some slight replication of minute surface structure of the 316 stainless substrate. At higher manifications, no defect structure was observed. These defects took the form of shadowed, thin and uncoated areas and nodular shadowed structures which may be due to spits of target material falling on the substrate.

X-ray chemical analysis showed that the coatings averaged a composition of 53.83% Nickel-46.17% Niobium by weight. The maximum nickel composition was found to be 57.66 weight percent, and the minimum value was 50.64 wt.% nickel for a variation over an 8 inch circle coating area of only 6.42%.

Wet corrosion test results showed that the films were quite good under test conditions set up for examination of other materials. While there was considerable pitting due to film defects, no failures of the entire sample were noted. In other words, there were no complete pores found which penetrated the entire 316 stainless steel substrate.

One interesting result was that no crevice corrosion was observed. This indicates that attack occurred entirely through the defects in the film and not on the Ni-Nb film itself. Generally, the following was observed: examination showed no attack in solutions of 2 molar NaCl for periods of 24 hours or less. Slight attack was observed in 2 molar HCl resulting in undercutting the film below defects except in the case of the degreased sample where film detachment occurrred. Exposure to 1 molar ferric chloride resulted in defect penetration followed by blistering at the site of attack. This caused localized detachment and pitting of the 316 stainless steel below the blistered coating. Microscopic examinations confirm this behavior.

The samples of 316 stainless steel coated with amorphous Ni-Nb and exposed to concentrated corrosives showed varied results. Note that no attempt was made to protect the edges or substrate backings in these tests. There was no attack in the case of concentrated nitric acid, either in the film or the substrate. After 60 hours in concentrated sodium hydroxide (NaOH), a slight blistering was observed at the edges of the sample, indicating penetration under the coating from the edge. The 60 hour test in concentrated HCl resulted in complete failure of the film. Here, attack initiated at the edges and at defects in the coating. The chloride ions selectively destroyed the samples by channeling attack at the grain boundaries and gases generated during attack caused rupture of the coating. Subsequent undercutting at the film-substrate interface caused approximately 50% of the resultant islands of coating to detach. The islands of coating remaining were cracked and undercut. Numerous small particles of coating material were found at the bottom of the test tube in which the test was made.

Apparently, attack is limited to chloride (and possible oxide) travel to the substrate along defects which exist in the coatings. There was little or no attack of the coating itself by the acid.

Film adhesion and defects in the coating appear to be the cause of all failures noted. This is not uncommon and, in fact, is evident in most tests of these types on resistant film. One can expect significant improvement in adhesion with sputter cleaning of the substrate and with in situ processing of the coating during the deposition. Such processing includes biasing the substrate to remove poorly deposited material while coating, rotation and tilting of the substrate during coating to eliminate shadowing so evident in line-of-sight processes and sputter/etch cycling to remove defects while coating. In addition, coatings considerably thicker than 1 micron can be applied. These coatings should completely eliminate any substrate surface defect replication.

EXAMPLE 4

In addition, amorphous alloys have been shown to exhibit excellent corrosion resistance in the form of free standing rapidly quenched ribbons and as sputter deposited coatings. (R. B. Diegle and M. D. Merz, Jn. Electrochem. Society Vol. 127, No. 9, 1980 p. 2030–2033. It is useful to note that when corrosion of an amorphous metal coated sample occurs, the initiation site is associated with surface features and imperfections that were already present in the uncoated substrate. In order to achieve the full benefits of the amorphous metal protective coatings, it is necessary to give careful attention to substrate preparation.

Beyond the established and confirmed corrosion behavior of amorphous metal films, applicants have discovered that this behavior is sensitive to annealing treatments below the crystallization temperature.

Films of Ni-40% were deposited to a thickness of 1 micron on 316 stainless steel substrates. Some samples were treated by annealing for 30 minutes under vacuum at 400° C. Both the treated and untreated samples were tested for corrosion resistance in 2 molar HCl and 1 molar $FeCl_3$ solutions. Microscopic observation revealed that the treated amorphous films displayed a significantly greater resistance to corrosion as compared to the untreated films. The enhanced corrosion resistance may be related to a possible stress relief or structural relaxation of the amorphous metal coating.

It will be understood that various changes and modifications can be made in the above-described invention without departing from the spirit thereof, particularly as defined in the following claims.

That which is claimed is:

1. A metallization device characterized by resistance to corrosion and suitably for high temperature applications which comprises
    a base selected from the group consisting of semiconductor devices, insulators, ohmic contacts, Schottky barrier contacts, rectifying contacts, metal interconnects, bonded lead wires and gate metallizations and,
    bonded to the surface of said base, a layer of a metal elected from the group consisting of a transition metal, a transition metal/normal metal alloy and a transition metal/metalloid alloy, said layer being in an amorphous state.

2. A metallization device as claimed in claim 1 in which the amorphous metal layer is characterized by improved resistance to corrosion after being annealed to the base at a temperature below the crystallization temperature of the amorphous metal layer.

3. A device as claimed in claim 1 in which the base is a semiconductor.

4. A device as claimed in claim 1 in which the base is an insulator.

5. A device as claimed in claim 1 in which the base is selected from the group consisting of Si, GaAs, GaP, glass and $SiO_2$.

6. A device as claimed in claim 1 in which the amorphous metal layer has a crystallization temperature in the range from above 200° C. to the melting point of the alloy.

7. A device as claimed in claim 1 in which the amorphous metal layer has a crystallization temperature above 500° C.

8. A device as claimed in claim 1 in which the alloy is a multicomponent alloy.

9. A device as claimed in claim 8 in which the alloy is a binary or ternary alloy.

10. A device as claimed in claim 1 in which the alloy is selected from the group consisting of Ni-Mo, Ni-Nb, Mo-Si, W-Si and Ni-Ta.

11. A device as claimed in claim 1 in which hafnium is included in the amorphous metal layer.

12. A device as claimed in claim 1 in which the amorphous metal layer is of a thickness within the range of 0.01 to 50 microns.

13. A device as claimed in claim 1 in which the amorphous metal layer is deposited by atomic deposition onto the base.

14. A device as claimed in claim 1 in which the amorphous metal layer is deposited onto the base by RF sputtering.

15. A device as claimed in claim 1 in which the amorphous metal functions as a barrier to interdiffusion between adjacent layers.

16. A device as claimed in claim 2 in which the amorphous metal layer is resistant to corrosion in the presence of a reagent selected from the group consisting of hydrochloric acid, nitric acid, ferric chloride and sodium chloride.

* * * * *